(12) United States Patent
Schaller et al.

(10) Patent No.: US 10,854,483 B2
(45) Date of Patent: Dec. 1, 2020

(54) HIGH PRESSURE STEAM ANNEAL PROCESSING APPARATUS

(71) Applicant: Applied Materials, Inc., Santa Clara, CA (US)

(72) Inventors: Jason M. Schaller, Austin, TX (US); Robert Brent Vopat, Austin, TX (US); Charles T. Carlson, Austin, TX (US); Jeffrey Charles Blahnik, Volente, TX (US); Timothy J. Franklin, Campbell, CA (US); David Blahnik, Round Rock, TX (US); Aaron Webb, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 154 days.

(21) Appl. No.: 16/157,808

(22) Filed: Oct. 11, 2018

(65) Prior Publication Data

US 2019/0148186 A1 May 16, 2019

Related U.S. Application Data

(60) Provisional application No. 62/586,935, filed on Nov. 16, 2017.

(51) Int. Cl.
*F27D 1/18* (2006.01)
*H01L 21/67* (2006.01)
(Continued)

(52) U.S. Cl.
CPC .... *H01L 21/67109* (2013.01); *H01L 21/6719* (2013.01); *H01L 21/6732* (2013.01);
(Continued)

(58) Field of Classification Search
CPC ............. F27D 3/12; F27D 1/18; F27D 1/1808
See application file for complete search history.

(56) References Cited

U.S. PATENT DOCUMENTS

| 4,524,587 A | 6/1985 | Kantor |
| 4,879,259 A | 11/1989 | Reynolds et al. |
| (Continued) | | |

FOREIGN PATENT DOCUMENTS

| CN | 101871043 A | 10/2010 |
| CN | 104047676 A | 9/2014 |
| (Continued) | | |

OTHER PUBLICATIONS

Taiwan Office Action dated Jun. 11, 2019 for Application No. 107138905.

(Continued)

*Primary Examiner* — Gregory A Wilson
(74) *Attorney, Agent, or Firm* — Patterson + Sheridan LLP

(57) ABSTRACT

Apparatuses for annealing semiconductor substrates, such as a batch processing chamber, are provided herein. The batch processing chamber includes a chamber body enclosing an internal volume, a cassette moveably disposed within the internal volume and a plug coupled to a bottom wall of the cassette. The chamber body has a hole through a bottom wall of the chamber body and is interfaced with one or more heaters operable to maintain the chamber body at a temperature of greater than 290° C. The cassette is configured to be raised to load a plurality of substrates thereon and lowered to seal the internal volume. The plug is configured to move up and down within the internal volume. The plug includes a downward-facing seal configured to engage with a top surface of the bottom wall of the chamber body and close the hole through the bottom wall of the chamber body.

20 Claims, 6 Drawing Sheets

(51) Int. Cl.
*H01L 21/673* (2006.01)
*H01L 21/687* (2006.01)

(52) U.S. Cl.
CPC .. *H01L 21/67103* (2013.01); *H01L 21/67126* (2013.01); *H01L 21/68792* (2013.01)

(56) References Cited

U.S. PATENT DOCUMENTS

| | | | |
|---|---|---|---|
| 5,050,540 A | 9/1991 | Lindberg | |
| 5,092,728 A * | 3/1992 | Crabb | C30B 29/06 118/719 |
| 5,114,513 A | 5/1992 | Hosokawa et al. | |
| 5,126,117 A | 6/1992 | Schumacher et al. | |
| 5,149,378 A | 9/1992 | Ohmi et al. | |
| 5,175,123 A | 12/1992 | Vasquez et al. | |
| 5,319,212 A | 6/1994 | Tokoro | |
| 5,329,095 A * | 7/1994 | Okase | C23C 16/46 219/390 |
| 5,366,905 A | 11/1994 | Mukai | |
| 5,578,132 A | 11/1996 | Yamaga et al. | |
| 5,590,695 A | 1/1997 | Siegele et al. | |
| 5,620,524 A | 4/1997 | Fan et al. | |
| 5,808,245 A | 9/1998 | Wiese et al. | |
| 5,858,051 A | 1/1999 | Komiyama et al. | |
| 5,879,756 A | 3/1999 | Fathi et al. | |
| 5,880,041 A | 3/1999 | Ong | |
| 5,940,985 A | 8/1999 | Kamikawa et al. | |
| 6,082,950 A | 7/2000 | Altwood et al. | |
| 6,136,664 A | 10/2000 | Economikos et al. | |
| 6,150,286 A | 11/2000 | Sun et al. | |
| 6,164,412 A | 12/2000 | Allman | |
| 6,164,963 A * | 12/2000 | Weaver | C30B 31/10 432/241 |
| 6,242,368 B1 | 6/2001 | Holmer et al. | |
| 6,251,751 B1 | 6/2001 | Chu et al. | |
| 6,299,753 B1 | 10/2001 | Chao et al. | |
| 6,319,766 B1 | 11/2001 | Bakli et al. | |
| 6,334,266 B1 | 1/2002 | Moritz et al. | |
| 6,368,412 B1 | 4/2002 | Gomi | |
| 6,442,980 B2 | 9/2002 | Preston et al. | |
| 6,468,490 B1 | 10/2002 | Shamouilian et al. | |
| 6,500,603 B1 | 12/2002 | Shioda | |
| 6,583,497 B2 | 6/2003 | Xia et al. | |
| 6,619,304 B2 | 9/2003 | Worm | |
| 6,730,885 B2 * | 5/2004 | Suzuki | H01L 21/67109 219/486 |
| 6,733,592 B2 * | 5/2004 | Fujikawa | H01L 21/67109 118/715 |
| 6,797,336 B2 | 9/2004 | Garvey et al. | |
| 7,055,333 B2 | 6/2006 | Leitch et al. | |
| 7,084,079 B2 | 8/2006 | Conti et al. | |
| 7,111,630 B2 | 9/2006 | Mizobata et al. | |
| 7,114,517 B2 | 10/2006 | Sund et al. | |
| 7,128,570 B2 * | 10/2006 | Oosterlaken | H01L 21/67126 432/242 |
| 7,211,525 B1 | 5/2007 | Shanker et al. | |
| 7,282,458 B2 | 10/2007 | Gates et al. | |
| 7,351,057 B2 * | 4/2008 | Berenbak | H01L 21/67126 432/242 |
| 7,361,231 B2 | 4/2008 | Fury et al. | |
| 7,460,760 B2 | 12/2008 | Cho et al. | |
| 7,491,658 B2 | 2/2009 | Nguyen et al. | |
| 7,503,334 B1 | 3/2009 | Shrinivasan et al. | |
| 7,521,089 B2 | 4/2009 | Hillman et al. | |
| 7,521,378 B2 | 4/2009 | Fucsko et al. | |
| 7,541,297 B2 | 6/2009 | Mallick et al. | |
| 7,576,441 B2 | 8/2009 | Yin et al. | |
| 7,650,965 B2 | 1/2010 | Thayer et al. | |
| 7,651,959 B2 | 1/2010 | Fukazawa et al. | |
| 7,655,532 B1 | 2/2010 | Chen et al. | |
| 7,815,739 B2 * | 10/2010 | Matsuura | H01L 21/31116 118/719 |
| 7,825,038 B2 | 11/2010 | Ingle et al. | |
| 7,825,042 B2 | 11/2010 | Mandal | |
| 7,867,923 B2 | 1/2011 | Mallick et al. | |
| 7,891,228 B2 | 2/2011 | Ding et al. | |
| 8,027,089 B2 | 9/2011 | Hayashi | |
| 8,306,026 B2 | 11/2012 | Anjum et al. | |
| 8,318,584 B2 | 11/2012 | Li et al. | |
| 8,349,085 B2 | 1/2013 | Tahara et al. | |
| 8,449,942 B2 | 5/2013 | Liang et al. | |
| 8,455,368 B2 | 6/2013 | Chandler et al. | |
| 8,466,073 B2 | 6/2013 | Wang et al. | |
| 8,481,123 B2 | 7/2013 | Kim et al. | |
| 8,536,065 B2 | 9/2013 | Seamons et al. | |
| 8,557,712 B1 | 10/2013 | Antonelli et al. | |
| 8,563,445 B2 | 10/2013 | Liang et al. | |
| 8,647,992 B2 | 2/2014 | Liang et al. | |
| 8,741,788 B2 | 6/2014 | Liang et al. | |
| 8,871,656 B2 | 10/2014 | Mallick et al. | |
| 8,906,761 B2 | 12/2014 | Kim et al. | |
| 8,936,834 B2 | 1/2015 | Kim et al. | |
| 9,121,515 B2 * | 9/2015 | Yamamoto | F16K 51/02 |
| 9,153,442 B2 | 10/2015 | Wang et al. | |
| 9,157,730 B2 | 10/2015 | Rajagopalan et al. | |
| 9,257,314 B1 | 2/2016 | Rivera et al. | |
| 9,306,026 B2 | 4/2016 | Toriumi et al. | |
| 9,362,107 B2 | 6/2016 | Thadani et al. | |
| 9,484,406 B1 | 11/2016 | Sun et al. | |
| 9,570,551 B1 | 2/2017 | Balakrishnan et al. | |
| 10,083,834 B2 | 9/2018 | Thompson et al. | |
| 10,096,516 B1 | 10/2018 | Leschkies et al. | |
| 10,276,411 B2 | 4/2019 | Delmas et al. | |
| 2001/0029108 A1 | 10/2001 | Tometsuka | |
| 2001/0041122 A1 | 11/2001 | Kroeker | |
| 2001/0050096 A1 | 12/2001 | Costantini et al. | |
| 2002/0066535 A1 | 6/2002 | Brown et al. | |
| 2002/0073922 A1 | 6/2002 | Frankel et al. | |
| 2002/0122885 A1 | 9/2002 | Ahn | |
| 2002/0134439 A1 | 9/2002 | Kawasaki et al. | |
| 2002/0148492 A1 | 10/2002 | Yamagata et al. | |
| 2002/0151128 A1 | 10/2002 | Lane et al. | |
| 2002/0155714 A1 | 10/2002 | Suzuki | |
| 2003/0030945 A1 | 2/2003 | Heinonen et al. | |
| 2003/0049372 A1 | 3/2003 | Cook et al. | |
| 2003/0101938 A1 | 6/2003 | Ronsse et al. | |
| 2003/0148035 A1 | 8/2003 | Lingampalli | |
| 2003/0148631 A1 | 8/2003 | Kuo et al. | |
| 2003/0207593 A1 | 11/2003 | Derderian et al. | |
| 2004/0025908 A1 | 2/2004 | Douglas et al. | |
| 2004/0060519 A1 | 4/2004 | Beauchaine et al. | |
| 2004/0074869 A1 | 4/2004 | Wang et al. | |
| 2004/0112409 A1 | 6/2004 | Schilling | |
| 2004/0219800 A1 | 11/2004 | Tognetti | |
| 2004/0248392 A1 | 12/2004 | Narwankar et al. | |
| 2005/0003655 A1 | 1/2005 | Cathey et al. | |
| 2005/0051194 A1 | 3/2005 | Sakashita et al. | |
| 2005/0136684 A1 | 6/2005 | Mukai et al. | |
| 2005/0191828 A1 | 9/2005 | Al-Bayati et al. | |
| 2005/0198971 A1 | 9/2005 | Leitch et al. | |
| 2005/0250347 A1 | 11/2005 | Bailey et al. | |
| 2005/0269291 A1 | 12/2005 | Kent | |
| 2006/0003596 A1 | 1/2006 | Fucsko et al. | |
| 2006/0105107 A1 | 5/2006 | Lindeboom et al. | |
| 2006/0124613 A1 | 6/2006 | Kumar et al. | |
| 2006/0175012 A1 | 8/2006 | Lee | |
| 2006/0207633 A1 | 9/2006 | Kim et al. | |
| 2006/0226117 A1 | 10/2006 | Bertram et al. | |
| 2006/0279025 A1 | 12/2006 | Heidari et al. | |
| 2006/0290017 A1 | 12/2006 | Yanagisawa | |
| 2007/0012402 A1 | 1/2007 | Sneh | |
| 2007/0045753 A1 | 3/2007 | Pae et al. | |
| 2007/0187386 A1 | 8/2007 | Kim et al. | |
| 2007/0204797 A1 | 9/2007 | Fischer | |
| 2007/0212850 A1 | 9/2007 | Ingle et al. | |
| 2007/0243317 A1 | 10/2007 | Du Bois et al. | |
| 2007/0256559 A1 | 11/2007 | Chen et al. | |
| 2008/0074658 A1 | 3/2008 | Davis et al. | |
| 2008/0083109 A1 | 4/2008 | Shibata et al. | |
| 2008/0115726 A1 | 5/2008 | Ingle et al. | |
| 2008/0121882 A1 | 5/2008 | Hwang et al. | |
| 2008/0210273 A1 | 9/2008 | Joe | |
| 2008/0251904 A1 | 10/2008 | Theuss et al. | |

(56) References Cited

U.S. PATENT DOCUMENTS

| | | |
|---|---|---|
| 2009/0018688 A1 | 1/2009 | Chandler et al. |
| 2009/0032190 A1* | 2/2009 | Takahashi ......... H01L 21/67757 156/345.33 |
| 2009/0081884 A1 | 3/2009 | Yokota et al. |
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1* | 6/2015 | Yoon .................. H01L 21/6719 118/725 |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0314964 A1 | 10/2016 | Tang et al. |
| 2016/0329190 A1 | 11/2016 | Evans et al. |
| 2016/0329458 A1 | 11/2016 | Evans et al. |
| 2016/0334162 A1 | 11/2016 | Kim et al. |
| 2016/0336405 A1 | 11/2016 | Sun et al. |
| 2016/0353522 A1 | 12/2016 | Rathi et al. |
| 2016/0355927 A1 | 12/2016 | Weaver et al. |
| 2016/0358809 A1 | 12/2016 | Brown et al. |
| 2016/0379853 A1 | 12/2016 | Schaller et al. |
| 2016/0379854 A1 | 12/2016 | Vopat et al. |
| 2017/0005204 A1 | 1/2017 | Hosoba et al. |
| 2017/0011932 A1 | 1/2017 | Pethe et al. |
| 2017/0084487 A1 | 3/2017 | Chebiam et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0003567 A1 | 1/2018 | Petry et al. |
| 2018/0019249 A1 | 1/2018 | Zhang et al. |
| 2018/0023192 A1 | 1/2018 | Chandra et al. |
| 2018/0096874 A1 | 4/2018 | Schaller et al. |
| 2018/0261480 A1 | 9/2018 | Liang et al. |
| 2018/0286674 A1 | 10/2018 | Manna et al. |
| 2018/0308669 A1 | 10/2018 | Bokka et al. |
| 2018/0315626 A1 | 11/2018 | Franklin |
| 2018/0323093 A1 | 11/2018 | Zhang et al. |
| 2018/0337027 A1 | 11/2018 | L'Heureux et al. |
| 2018/0342384 A1 | 11/2018 | Wong et al. |
| 2018/0350563 A1 | 12/2018 | Manna et al. |
| 2019/0019708 A1 | 1/2019 | Weaver et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0157074 A1 | 5/2019 | Delmas |
| 2019/0170591 A1 | 6/2019 | Petry et al. |
| 2019/0198368 A1 | 6/2019 | Weaver et al. |
| 2019/0228982 A1 | 7/2019 | Chen et al. |
| 2019/0229004 A1 | 7/2019 | Schaller et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0259638 A1 | 8/2019 | Schaller et al. |
| 2019/0279879 A1 | 9/2019 | Singh et al. |
| 2019/0311896 A1 | 10/2019 | Balseanu et al. |
| 2019/0326138 A1 | 10/2019 | Forderhase et al. |
| 2019/0360100 A1 | 11/2019 | Nguyen et al. |
| 2019/0360633 A1 | 11/2019 | Schaller et al. |
| 2019/0368035 A1 | 12/2019 | Malik et al. |
| 2019/0375105 A1 | 12/2019 | Weaver et al. |
| 2020/0035509 A1 | 1/2020 | Khan et al. |
| 2020/0035513 A1 | 1/2020 | Khan et al. |
| 2020/0075392 A1 | 3/2020 | Brown et al. |
| 2020/0098574 A1 | 3/2020 | Wong et al. |

FOREIGN PATENT DOCUMENTS

| | | |
|---|---|---|
| CN | 104089491 A | 10/2014 |
| JP | 06-283496 | 10/1994 |
| JP | H07048489 B2 | 5/1995 |
| JP | 2001110729 A | 4/2001 |
| JP | 2003-51474 A | 2/2003 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2008/073611 A | 4/2008 |
| JP | 2009129927 A | 6/2009 |
| JP | 2010-205854 A | 9/2010 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| KR | 63-004616 | 1/1988 |

(56) References Cited

FOREIGN PATENT DOCUMENTS

| | | |
|---|---|---|
| KR | 20030052162 A | 6/2003 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-0035000 A | 4/2010 |
| KR | 20110136532 A | 12/2011 |
| KR | 101287035 B1 | 7/2013 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| WO | 2005057663 A2 | 6/2005 |
| WO | 2008/089178 A2 | 7/2008 |
| WO | 2011/103062 A2 | 8/2011 |
| WO | 2012/133583 A1 | 10/2012 |
| WO | 2016018593 A1 | 2/2016 |
| WO | 2016065219 A1 | 4/2016 |

OTHER PUBLICATIONS

International Search Report and Written Opinion for International Application No. PCT/US2019/029602 dated Aug. 14, 2019.
International Search Report and Written Opinion for PCT/US2018/021715 dated Jun. 22, 2018.
International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
Office Action for Japanese Application No. 2018-546484 dated Oct. 8, 2019.
International Search Report and Written Opinion for International Application No. PCT/US2019/040195 dated Oct. 25, 2019.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/038822 dated Oct. 26, 2018.
International Search Report and Written Opinion for International Application No. PCT/US2019/059659 dated Feb. 26, 2020.
Office Action from Taiwan Patent Application No. 108104585 dated Jan. 30, 2020, with concise statement of relevance.
Pedestal definition from Dictionary.com, printed on Feb. 10, 2020 (year 2020).
International Search Report and Written Opinion for PCT/US2018/043160 dated Jan. 31, 2019.
International Search Report and Written Opinion for PCT/US2018/059643 dated Feb. 26, 2019.
International Search Report and Written Opinion from PCT/US2019/012161 dated Apr. 30, 2019.
Taiwan Office Action dated Nov. 19, 2019 for Application No. 108103415.
Office Action for Japanese Application No. 2018-517285 dated Oct. 23, 2019.
Office Action for Taiwan Patent Application No. 108111501 dated Nov. 14, 2019.
International Search Report and Written Opinion for PCT/US2019/014759 dated May 14, 2019.
International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136181.
International Search Report and Written Opinion for PCT/US2018/050464 dated Jan. 4, 2019.
International Search Report and Written Opinion for PCT/US2019/056447 dated Feb. 7, 2020.
KR Office Action dated Feb. 4, 2020 for Application No. 10-2018-0133399.
Taiwan Office Action dated Feb. 21, 2020 for Application No. 108138212.

\* cited by examiner

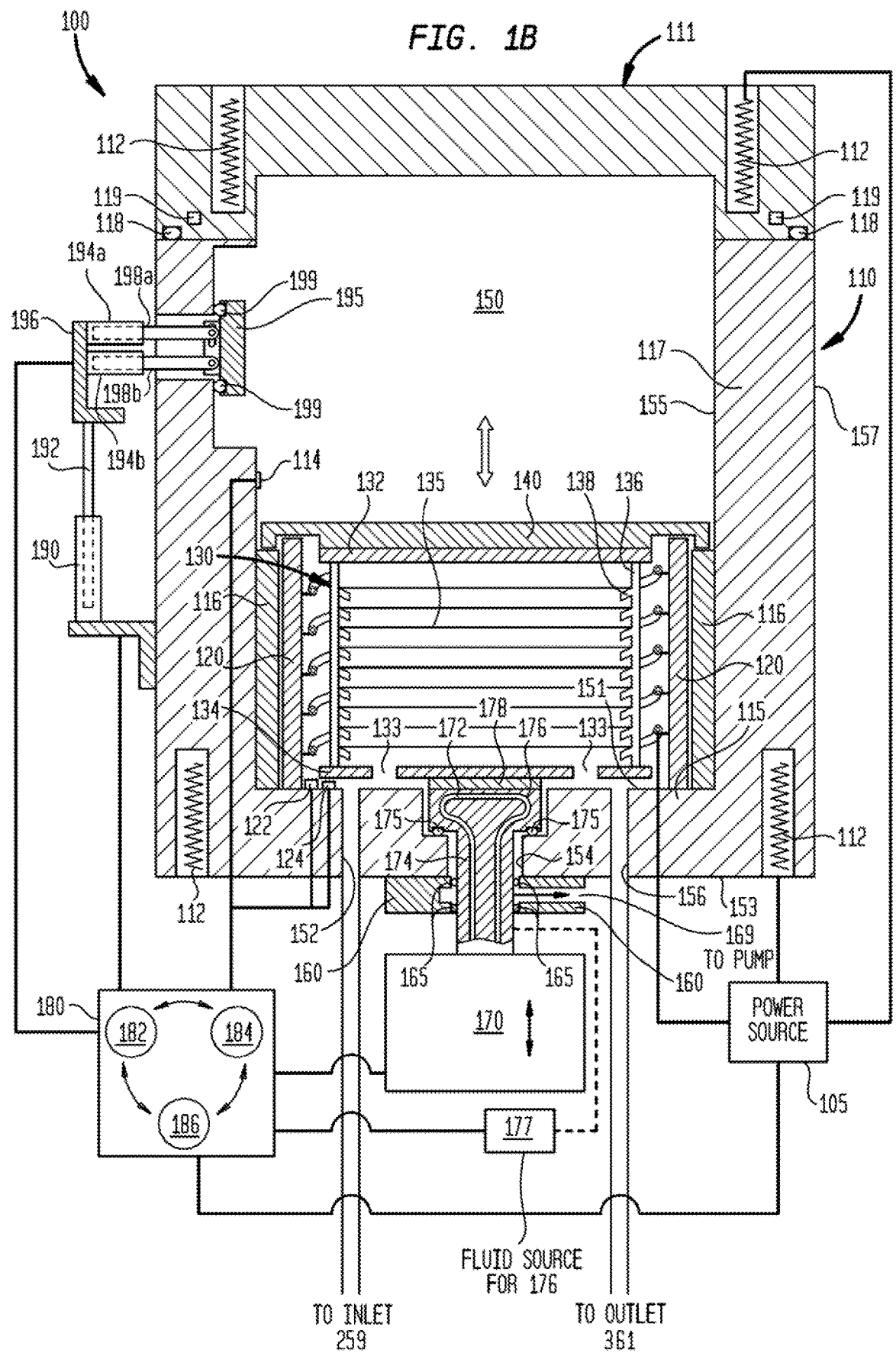

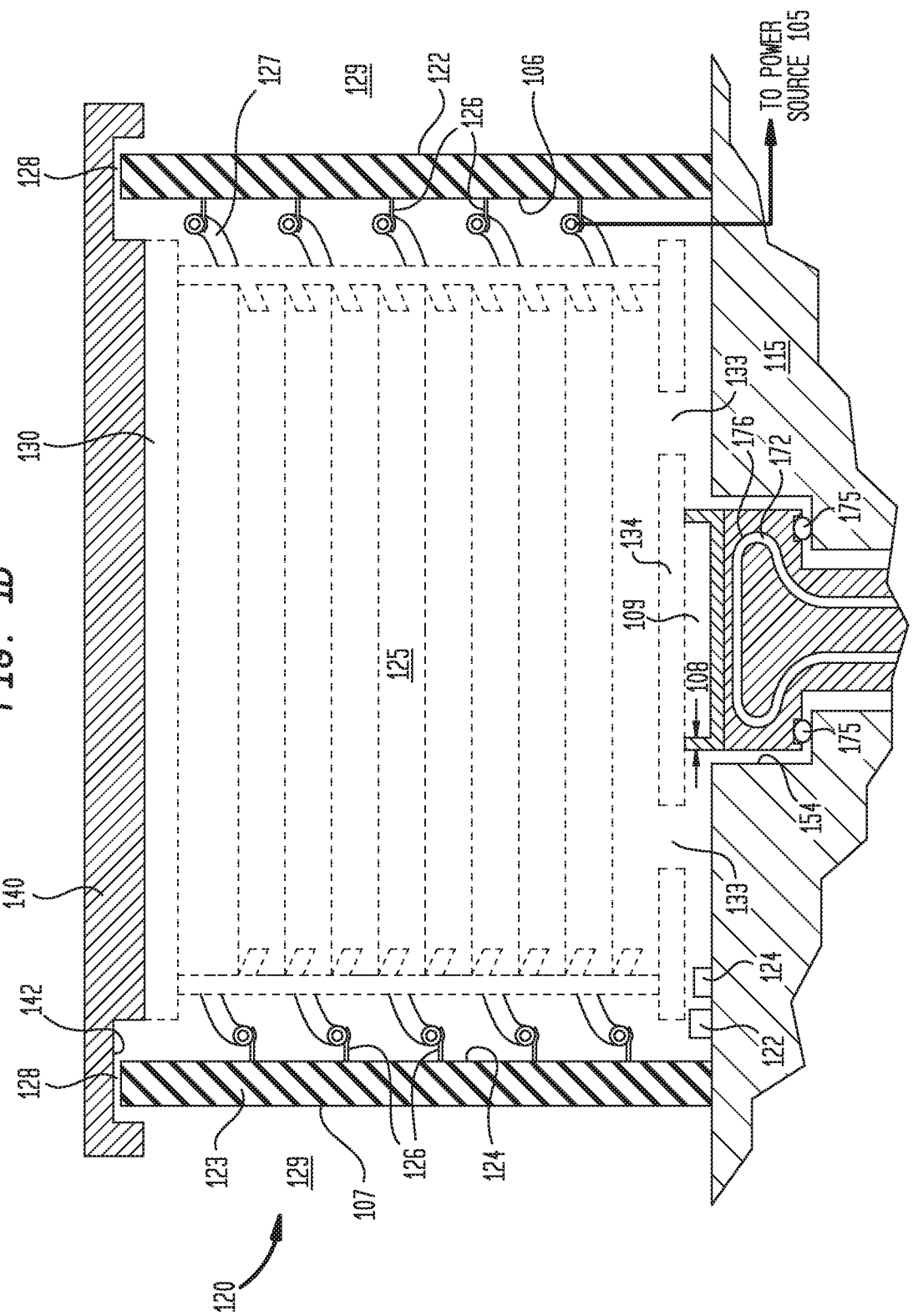

HIGH PRESSURE STEAM ANNEAL PROCESSING APPARATUS

CROSS-REFERENCE TO RELATED APPLICATIONS

This application claims benefit of U.S. Appl. No. 62/586,935, filed Nov. 16, 2017, which is herein incorporated by reference.

BACKGROUND

Field

Embodiments of the disclosure generally relate to fabrication of integrated circuits and particularly to an apparatus for annealing one or more semiconductor substrates.

Description of the Related Art

Formation of a semiconductor device, such as memory devices, logic devices, microprocessors, or the like, involves deposition of one or more films over a semiconductor substrate. The films are used to create the circuitry required to manufacture the semiconductor device. Annealing is a heat treatment process used to achieve various effects on the deposited films to improve their electrical properties. For example, annealing can be used to activate dopants, densify the deposited films, or change states of grown films.

Semiconductor device geometries have dramatically decreased in size since introduction several decades ago. Increasing device densities have resulted in structural features having decreased spatial dimensions. For example, in high aspect ratio (ratio of depth to width) gaps and trenches, the structural features of modern semiconductor devices have narrowed to a point where filling the gap with material has become extremely challenging, particularly in that the properties of material filling the gap cannot be reliably controlled. Conventional annealing processes suitable for improving properties of bulk deposited materials have not demonstrated an ability to improve properties of materials deposited in high aspect ratio features.

Thus, there is a need for an improved method and apparatus for annealing semiconductor substrates.

SUMMARY

Embodiments of the disclosure generally relate to an apparatus for annealing one or more semiconductor substrates. In one embodiment, a batch processing chamber is disclosed. The batch processing chamber includes a chamber body enclosing an internal volume, a cassette moveably disposed within the internal volume, and a plug coupled to a bottom wall of the cassette. The chamber body has an opening through a bottom wall of the chamber body. A shaft is disposed through the opening formed in the chamber body and coupled to the cassette. The chamber body is interfaced with one or more heaters operable to maintain the chamber body at a temperature of greater than 290° C. The cassette is configured to be raised to a first position to load a plurality of substrates thereon, and lowered into a second position beneath the first position for processing. The plug includes a downward-facing seal configured to engage with a top surface of the bottom wall of the chamber body when the cassette is in the second position. The seal circumscribes the opening and shaft, and seals against the bottom wall of the chamber body.

In another embodiment, a batch processing chamber includes a chamber body enclosing an internal volume, a cassette moveably disposed within the internal volume and a hollow cylindrical shell disposed within the internal volume. The chamber body is interfaced with one or more heaters operable to maintain the chamber body at a temperature of greater than 290° C. The cassette is movable between a first position and a second position beneath the first position. In the first position, the cassette is disposed above the shell. In the second position, the cassette is circumscribed by the shell. One or more heaters are disposed between an inner surface of the shell and the cassette.

In yet another embodiment, a batch processing chamber includes a chamber body enclosing an internal volume, a cassette moveably disposed within the internal volume, a plug coupled to a bottom wall of the cassette, a hollow cylindrical shell disposed within the internal volume, a lid disposed on the cassette and a door configured to sealably close a loading port formed through a sidewall of the chamber body. The chamber body includes one or more heaters operable to maintain the chamber body at a temperature of greater than 290° C. The cassette has one or more gas entry openings formed through a bottom wall thereof. The cassette is movable between a first position and a second position below the first position. In the first position, the cassette is disposed above the shell. In the second position, the cassette is laterally circumscribed by the shell. The plug is coupled to a shaft and includes a downward-facing seal that surrounds the opening and is configured to engage with a top surface of the bottom wall of the chamber body when the cassette is in the second position. The plug also includes a cooling channel disposed within. The shell has one or more heaters disposed on an inner surface thereof. The lid has a diameter greater than an outer diameter of the shell.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 1B is a schematic sectional view of the batch processing chamber with the cassette in a lowered position for processing the plurality of substrates.

FIG. 1D is a partial schematic sectional view of a cylindrical shell positioned within the batch processing chamber.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
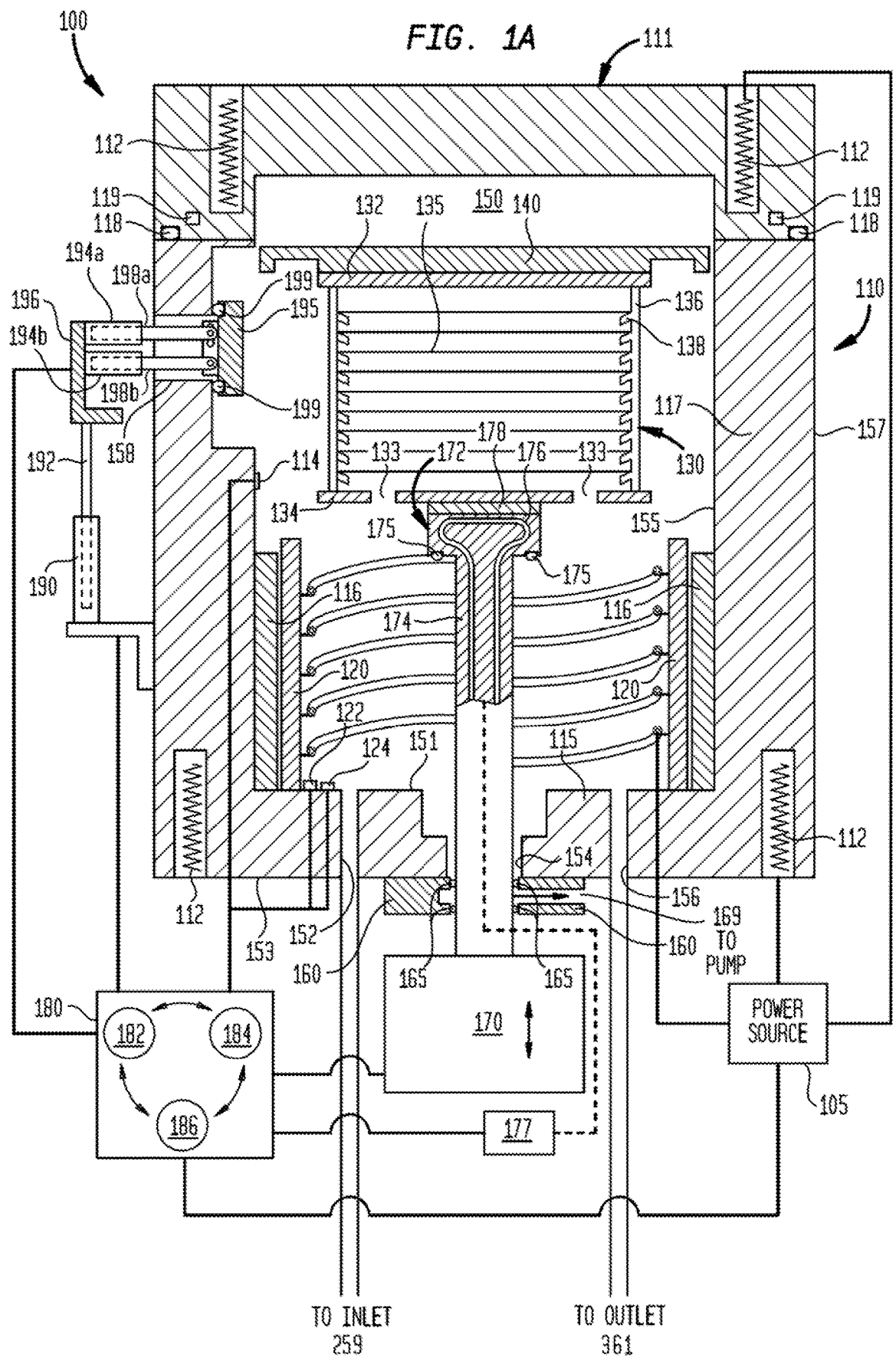
FIG. 1A is a schematic sectional view of a batch processing chamber with a cassette in a raised position for loading a plurality of substrates into the cassette.

Embodiments of the disclosure generally relate to methods and apparatuses for annealing one or more substrate, such as semiconductor substrates. In one example, an apparatus is a batch processing chamber that operates to process a plurality semiconductor substrates located on a cassette that is disposed within the batch processing chamber. The batch processing chamber anneals the substrates under a pressure of up to 70 bar and at a temperature of up to 550° C. when the cassette is in a lowered, e.g., processing, position. In one example described herein, a bottom wall of the cassette includes a downwardly facing seal that closes the batch processing chamber when the cassette is in a lowered position. Thus at processing pressures above atmospheric pressure, a pressure differential across the cassette and a bottom interface forces the seal into compression, which advantageously creates a more robust seal as compared to dynamic seals typically used in shaft sealing applications. Similarly, a slit valve door of the batch processing chamber seals from the interior volume of the processing chamber, and likewise the seals of the silt valve door are forced into compression when the interior volume of the processing chamber is at an elevated pressure. In other embodiments, the batch processing chamber incorporates a hollow cylindrical shell. The shell functions to retain heat generated by one or more heaters disposed within the bounds of the shell and located between the shell and the cassette. The shell also substantially reduces the amount of heat transferred to sidewalls of the processing chamber.

FIG. 1 is a schematic sectional view of a batch processing chamber 100 with a cassette 130 disposed in a first position, e.g., a raised position or a loading position, for loading a plurality of substrates 135 into the cassette 130. The batch processing chamber 100 has a chamber body 110 enclosing an internal volume 150, and a lid 111 disposed on the chamber body 110. The chamber body 110 has an annular shape, though in other embodiments the body 110 may be rectangular or any closed shape.

The chamber body 110 may be fabricated in one or more sections. In the embodiment shown in FIG. 1, the chamber body 110 includes lid 111 includes a bottom wall 115, a sidewall 117. The bottom wall 115 has an inner surface 151 and an outer surface 153. The sidewall 117 has an inner surface 155 and an outer surface 157. The lid 111 and the chamber body 110 are held together by a static seal 118. A cooling channel 119 is disposed adjacent to the static seal 118. In other embodiments (not shown), the chamber body 110 may include an upper spool and a lower spool positioned between the bottom 115 and the lid 111. The chamber body 110 may be fabricated from nickel-based steel alloys that exhibit high resistance to corrosion, such as but not limited to one or more Hastelloy®, Iconel®, and Monel® alloys.

One or more cartridge heaters 112 are disposed within the chamber body 110, for example, within a recess of the bottom 115 or the sidewall 117. The heaters 112 are configured to actively heat the chamber body 110 and maintain the chamber body 110 at a temperature of greater than 290° C. Each of the heaters 112 may be a resistive coil, a lamp, a ceramic heater, a graphite-based carbon fiber composite (CFC) heater, a stainless steel heater or an aluminum heater. The heaters 112 are powered by a power source 105. A temperature sensor 114 is coupled to the chamber body 110 and configured to monitor the temperature of the chamber body 110. Power to the heaters 112 is controlled by the controller 180 through feedback received from the temperature sensor 114. An optional insulating liner 116 made of a material having a low coefficient of heat transfer (at least relative to the shield), such as, but not limited to, quartz, may be disposed in the internal volume 150 along the inner surface 155 of the sidewall 117 of the chamber body 110. In such an example, the liner 116 is disposed between a shell 120 and the sidewall 117, advantageously reducing the amount of heat transferred between the shell 120 and the sidewall 117, thus assisting regulating the temperature of the sidewall 117.

The cassette 130 is moveably disposed within the internal volume 150. The cassette 130 may be fabricated from quartz, ceramic, or other thermally non-conductive material. The cassette 130 houses a plurality of substrates 135 therein to facilitate transfer of the plurality of substrates 135 into and out of the batch processing chamber 100. Moreover, the cassette 130 facilitates transfer of substrates 135 between a first position within the batch processing chamber 100 and a second position within the batch processing chamber 100 such that the substrates 135 are annealed at an elevated pressure and an elevated temperature.

The cassette 130 includes a top wall 132, a bottom wall 134, and a sidewall 136. The sidewall 136 of the cassette 130 has a plurality of substrate storage slots 138 formed on an inward surface thereof. Each substrate storage slot 138 is evenly spaced vertically along the inner surface of the sidewall 136 of the cassette 130. Each substrate storage slot 138 is configured to hold one of the plurality of substrates 135 thereon. In one example, the cassette 130 may have as many as 25 substrate storage slots 138 for holding the substrates 135. In other examples, more or less than 25 substrate storage slots 138 are contemplated. The bottom wall 134 has one or more apertures 133 formed therethrough which facilitate fluid flow into the cassette 130.

Figure 1C:
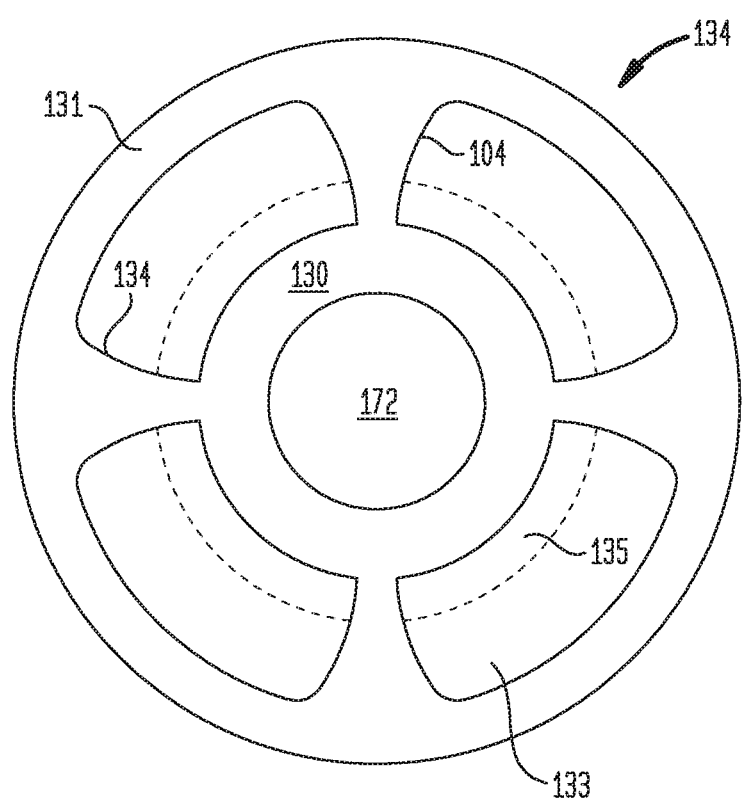
FIG. 1C is a schematic bottom view of the cassette.

FIG. 1C is a schematic bottom view of the cassette 130. In one embodiment, as shown in FIG. 1C, the bottom wall 134 of the cassette 130 includes one or more spokes 104 radially extending from a central portion 330 to an annular-shaped peripheral portion 131, defining the apertures 133 between adjacent spokes 104.

Returning to FIG. 1A and FIG. 1B, a plug 172 is coupled to the bottom wall 134 of the cassette 130. The plug 172 includes one or more seals 175. The seals may be disposed on a lower surface of the plug 172. The plug 172 is positioned vertically above an opening 154 formed through the bottom wall 115 of the chamber body 110. The plug 172 actuates vertically up and down with the cassette 130 during operation of the batch processing chamber 100. In some aspects, as shown in FIGS. 1 and 2, the opening 154 includes a stepped upper profile formed in the inner surface 151 and configured to accommodate the plug 172 therein. During operation, the plug 172 is actuated vertically downward and engages a bottom surface of the stepped profile of the opening 154 with the seal 175, thereby forming a seal between the plug 172 and the bottom wall 115 to prevent fluid flow through the opening 154 of the batch processing chamber 100.

When the plug engages the inner surface 151, the elevated pressure within the batch processing chamber 100, which is greater than the pressure outside of the batch processing chamber 100, forces the seal 175 into engagement with the inner surface 151. By forcing the seal 175 into engagement, a stronger and more fluid-tight seal is created. In one example, the seal 175 is made from a high-temperature polymer, such as but not limited to a perfluoroelastomer. In some embodiments, the seal 175 is an O-ring. In some embodiments, the plug 172 may be excluded. In such an example, the bottom wall 134 of the cassette 130 seals against the bottom 115. It is contemplated that in such an example, the seals 175 may be positioned on a lower surface of the bottom wall 134 of the cassette 130, or optionally, the seals 175 may be excluded.

The plug 172 also includes a cooling channel 176 disposed therein adjacent to the seal 175. The cooling channel 176 is fluidly connected to a cooling fluid source 177. A cooling fluid, such as but not limited to an inert, dielectric, and high-performance heat transfer fluid, may be circulated within the cooling channel 176. The cooling channel 176 is configured to cool the plug 172 and the seal 175 to maintain the seal 175 below a maximum integrity temperature (e.g., about 325° C.) during operation, thereby prolonging the useful life of the seal 175. The plug 172 is coupled to a shaft 174 which moves the plug 172 and the cassette 130 up and down within the internal volume 150. The plug 172 is disposed at an upper end of the shaft 174, and may be a separate component of the shaft 174 or may be integrally formed therewith. A lower end of the shaft 174 is coupled to an actuator 170 which facilitates motion of the shaft 174. The shaft 174 and the actuator 170 are controlled by the controller 180.

The batch processing chamber 100 also includes a vacuum lip seal 160. The vacuum lip seal 160 is positioned adjacent the outer surface 153 of the bottom wall 115, between the outer surface 153 and the actuator 170. The vacuum lip seal 160 includes a seal 165 to facilitate sealing of the vacuum lip seal 160 around the shaft 174. The seal 165 may be made from a high-temperature polymer, such as but not limited to a perfluoroelastomer. The vacuum lip seal 160 functions as a back-up or redundant seal to the seals 175. In the event of failure of the seal 175, pressurized fluid or air escaping from the internal volume 150 is directed through an outlet 169 which is fluidly connected to a pump (not shown). During low-pressure operation, as the shaft 174 moves the cassette 130 up and down within the internal volume 150 of the batch processing chamber 100, the vacuum lip seal 160 prevents leakage of pressurized processing fluid or air from the internal volume 150, or ingress of ambient air into the internal volume 150.

In some embodiments, as shown in FIGS. 1A and 1B, the batch processing chamber 100 also includes a thermal break 178. The thermal break is positioned adjacent an upper surface of the plug 172 and a lower surface of the bottom wall 134 of the cassette 130. The thermal break 178 may be adhered to the bottom wall 134, or to the upper surface of the plug 172. The thermal break 178 is fabricated from ceramic, however, other materials are also contemplated. The thermal break 178 is configured to restrict the flow of heat from the cassette 130 to outside the chamber by mitigating heat transfer between the cassette 130 and the shaft 174.

FIG. 1D is a partial schematic sectional view of a cylindrical shell positioned within the batch processing chamber. The cylindrical shell 120 is positioned between the cassette 130 (when in the lowered position) and the optional insulating liner 116.

The shell 120 includes a wall 123 having a heater 127 coupled to an inner surface 106 thereof. The shell 120 is configured to heat a processing region 125 located within the wall 123, and to shield an outer region 129 outside the wall 123 from the heat in the processing region 125. Stated otherwise, the shell 120 facilitates thermal separation between the processing region 125 and the outer region 129. The wall 123 may be fabricated from a highly reflective sheet metal or a nickel-based steel alloy such as Hastelloy® alloy. An outer surface 107 of the wall 123 may optionally be coated with an insulating layer (not shown) to further facilitate thermal separation between the processing region 125 and the outer region 129.

The inner surface 106 of the wall 123 has a plurality of hooks 126, such as ceramic hooks, coupled thereto. The plurality of hooks 126 supports one or more heaters 127 thereon. The heaters 127 are arranged in a helical or axially-aligned configured, and are configured to heat the processing region 125 and the plurality of substrates 135 placed therein during an annealing operation. In one example, the one or more heaters 127 are configured to heat the processing region 125 to a temperature of up to 550° C. The heaters may be for, example, resistive heaters, formed from nick-chromium alloy. The heaters 127 within the shell 120 are electrically connected to the power source 105. In one example, the inner surface 106 is thermally reflective and is configured to reflect heat generated by the heaters 127 back into the processing region 125. In some aspects, the inner surface 1 may include a reflective coating thereon to further enhance thermal reflection.

A pressure sensor 122 is positioned in the processing region 125 on an inner surface 151 of the bottom 115. The pressure sensor 122 is configured to measure the pressure of the processing region 125 during the annealing process. A temperature sensor 124 is positioned in the processing region 125 on the inner surface 151 of the bottom 115 adjacent the pressure sensor 122, and the temperature sensor 124 is configured to measure the temperature of the processing region 125 during the annealing process.

A lid 140 of the cassette 130 includes an annular recess 142 on a lower surface thereof. The annular recess 142 is configured to be disposed over the wall 123 of the shell 120, and form a gap 128 between the wall 123 and the lid 140. In one example, the lid 140 has a diameter greater than an outer diameter of the shell 120 to accommodate annular recess 142. When a processing fluid is introduced into the processing region 125, the gap 128 allows any residual air to be displaced by the processing fluid into the internal volume 150 (shown in FIG. 1B).

FIG. 1D also illustrates an example of the thermal break 178. In the illustrated example, the thermal break 178 is shaped as a capsulated cup. The capsulate cup minimizes contact with the bottom wall 134 of the cassette 130. As shown in FIG. 1D, the thermal break 178 has a thin cylindrical wall 108 surrounding a hollow central portion 109. The hollow central portion 109 and the thin cylindrical wall reduce heat transfer between the cassette 130 and the plug 172. In another example, it is contemplated that the thermal break 178 may omit the hollow central portion 109. In such an example, the thermal break 178 may be formed from a thermally insulating material.

Figure 1E:
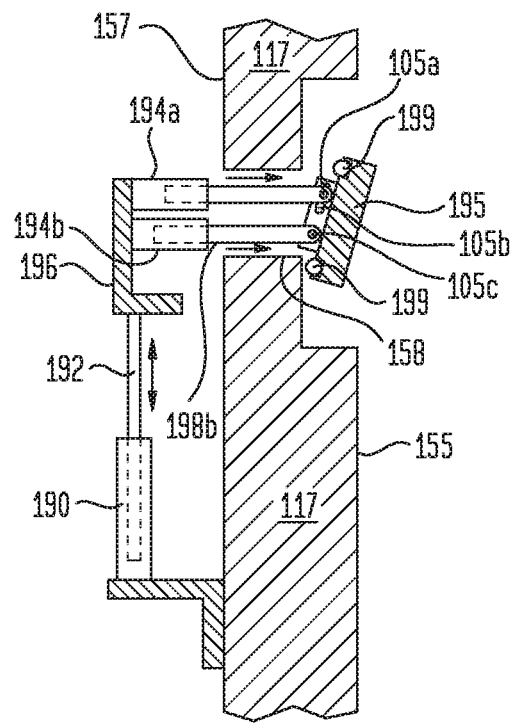
FIG. 1E is a schematic sectional view of a slit valve door in an open configuration.
Figure 1F:
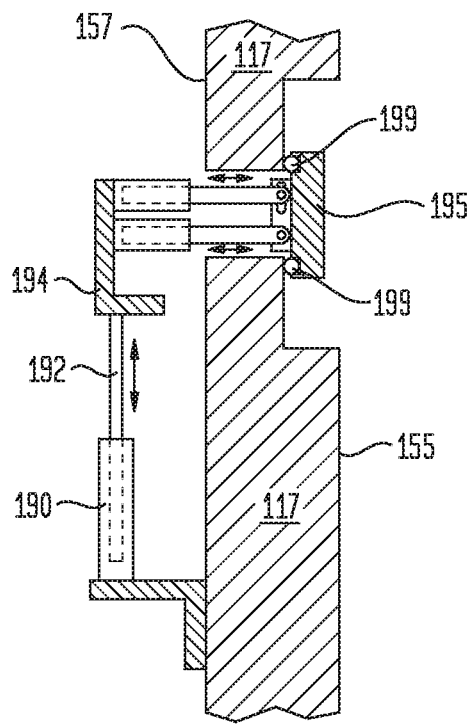
FIG. 1F is a schematic sectional view of a slit valve door in a closed configuration.
Figure 2:
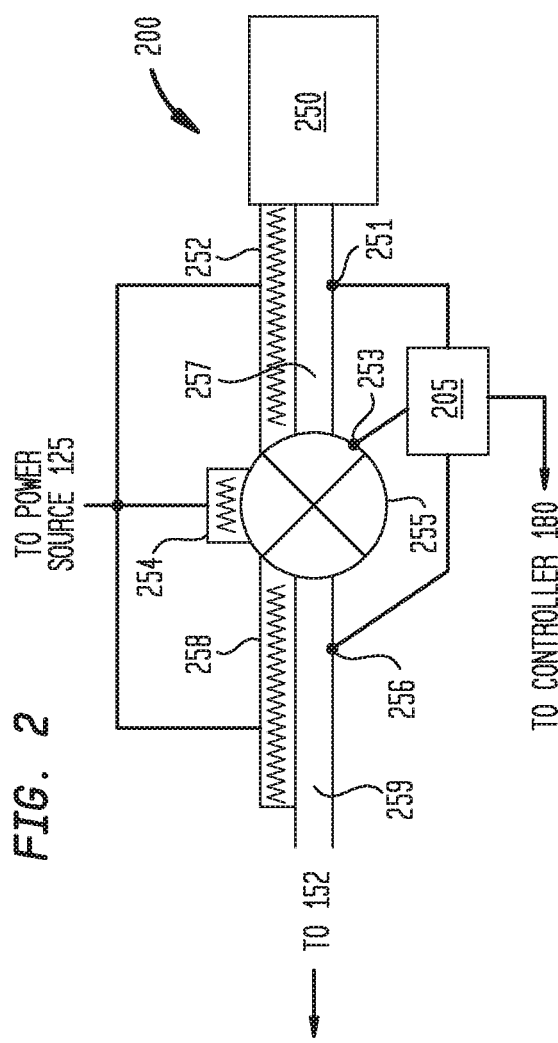
FIG. 2 is a schematic view of a temperature-controlled inlet fluid circuit connected to an inlet of the batch processing chamber.

Returning to FIGS. 1A and 1B, and with reference to FIGS. 1E and 1F, a loading port 158 is formed through the sidewall 117 of the chamber body 110. FIG. 1E is a schematic sectional view of a slit valve door 195 in an open configuration. FIG. 1F is a schematic sectional view of a slit valve 195 door in a closed configuration. During processing, a plurality of substrates 135 can be loaded into or unloaded from the batch processing chamber 100 through the loading port 158. A slit valve door 195 is used to provide access to the internal volume 150 through the loading port 158 by selectively opening and closing the loading port 158. The slit valve door 195 is configured to engage an inner surface 155 of the sidewall 117 surrounding the loading port 158. A seal 199 facilitates closure of the slit valve door 195 by sealing over the loading port 158. Elevated pressures within the internal volume 150 force the slit valve door 195 and the seal 199 into engagement with the inner surface 155, further. The seal 199 may be made from a high-temperature polymer, such as but not limited to a perfluoroelastomer. In some embodiments, the seal 199 may be an O-ring.

The slit valve door 195 includes a rotating pin 105a positioned in an elongated slot 105b. The pin 105a couples the slit valve door 195 to a bar 198a. The bar 198a is coupled to a horizontal actuator 194a and a vertical actuator 190. The horizontal actuator 194a is configured to linearly move one end of the slit valve door 195 within the internal volume 150 towards and away from the loading port 158. Upon actuation of the horizontal actuator 194a, the slit valve door 195 pivots about a pin 105c while the pin 105a moves within the elongated slot 105b. To provide clearance for rotation of the slit valve door 195, a second horizontal actuator 194b may facilitate movement of the slit valve door 195 away from the inner surface 155 via a bar 198b. The slit valve door 195 may be pivoted into a non-vertical orientation, such as about 45 degrees relative to the inner surface 155, to provide for ingress and egress of substrates. To provide additional clearance, the horizontal actuators 194a, 194b may be coupled to a bracket 196, which is coupled to the vertical actuator 190 by a link 192, to facilitate actuation of the bracket 196. Vertical actuation of the bracket 196 provides additional clearance within the loading port 158 by moving bars 198a, 198b vertically within the loading port 158. Motion of the slit valve door 195 and respective actuators 190, 194a, 194b is controlled by the controller 180.

To facilitate airflow within the batch processing chamber 100, an inlet port 152 is formed through the bottom wall 115 of the chamber body 110 and fluidly connects an inlet conduit 259 (shown in FIG. 2) to the internal volume 150. An outlet port 156 is also formed through the bottom wall 115 and connects the internal volume 150 to an outlet conduit 361 (shown in FIG. 3). The inlet port 152 is fluidly coupled to a gas supply source to provide one or more gases (e.g., reagents, precursors, purge gas, or carrier gas).

FIG. 2 schematically illustrates a temperature-controlled inlet fluid circuit 200. The temperature-controlled inlet fluid circuit 200 is fluidly connectable to the inlet port 152 via an inlet conduit 259. The inlet fluid circuit 200 includes a gas panel 250, a source conduit 257, and an inlet isolation valve 255 coupled to the inlet conduit 259. One or more heaters 252, 254, and 258 are interfaced with different portions of the inlet fluid circuit 200 to facilitate temperature control throughout the inlet fluid circuit 200. One or more temperature sensors 251, 253, and 256 are interfaced with different portions of the inlet fluid circuit 200 to obtain temperature measurements and provide the temperature measurement information to the controller 180, thereby facilitating feedback control.

As shown in FIG. 2, the source conduit 257 is interfaced with and in thermal communication with the heater 252. The inlet isolation valve 255 is interfaced with and in thermal communication with the heater 254. The inlet conduit 259 is interfaced with and in thermal communication with the heater 258. The temperature sensor 251 is interfaced with the source conduit 257 and configured to measure the temperature of the source conduit 257. The temperature sensor 253 is interfaced with the inlet isolation valve 255 and configured to measure the temperature of the inlet isolation valve 255. The temperature sensor 256 is interfaced with the inlet conduit 259 and configured to measure the temperature of the inlet conduit 259. A temperature reading device 205 receives and displays the temperature measurements from the temperature sensors 251, 253 and 256. The temperature reading device 205 sends the temperature information to the controller 180 to facilitate temperature control of the inlet fluid circuit 200.

Figure 3:
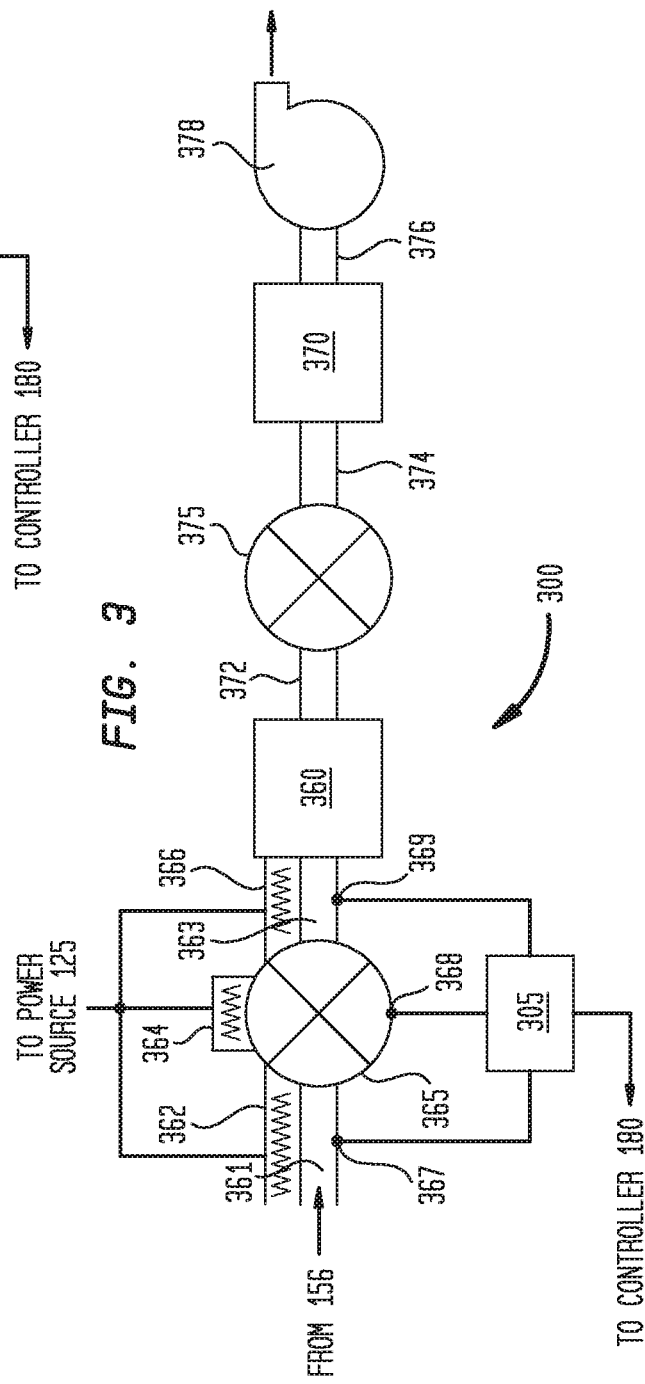
FIG. 3 is a schematic view of a temperature-controlled outlet fluid circuit connected to an outlet of the batch processing chamber.

FIG. 3 schematically illustrates a temperature-controlled outlet fluid circuit 300. The outlet fluid circuit 300 is fluidly connectable to the outlet port 156 via an outlet conduit 361. The outlet fluid circuit 300 includes an outlet isolation valve 365, an exhaust conduit 263, a condenser 360, and a pump 378. One or more heaters 362, 364, and 366 are interfaced with different portions of the outlet fluid circuit 300 to facilitate thermal control of the outlet fluid circuit 300. One or more temperature sensors 367, 368, and 369 are interfaced with different portions of the outlet fluid circuit 300 to obtain temperature measurements and provide the temperature measurement information to the controller 180. As shown in FIG. 3, the outlet conduit 361 is interfaced with and in thermal communication with the heater 362. The outlet isolation valve 265 is interfaced with and in thermal communication with the heater 364. The exhaust conduit 363 is interfaced with and in thermal communication with the heater 366. The temperature sensor 367 is interfaced with the outlet conduit 361 and configured to measure the temperature of the outlet conduit 361. The temperature sensor 368 is interfaced with the outlet isolation valve 365 and configured to measure the temperature of the outlet isolation valve 365. The temperature sensor 369 is interfaced with the exhaust conduit 363 and configured to measure the temperature of the exhaust conduit 363. A temperature reading device 305 receives and displays the temperature measurements from the temperature sensors 367, 368 and 369. The temperature reading device 305 sends the temperature information to the controller 180 to facilitate temperature control of the outlet fluid circuit 300.

A condenser 360 is fluidly coupled to the internal volume 150 and configured to condense a processing fluid exiting the internal volume 150 through the outlet conduit 361. Optionally, the condensed processing fluid exiting the condenser 360 may be routed through a heat exchanger 370 via an isolation valve 375. The heat exchanger 370 is configured to further cool the condensed processing fluid so that the processing fluid may be more easily managed. The condenser 360 is fluidly connected to the isolation valve 375 by a condenser conduit 372. The heat exchanger 370 is coupled to the isolation valve 375 by a heat exchanger conduit 374. A pump 378 is fluidly connected to the heat exchanger 370 by a pump conduit 376 to facilitate pumping of the liquefied processing fluid from the heat exchanger 370 to a container (not shown) for recycling, reuse or disposal.

With reference to FIGS. 2 and 3, the heaters 252, 254, 258, 362, 364, and 366 are configured to maintain a processing fluid that is flowing through the fluid circuits 200 and 300 at a predetermined temperature. In one example, the predetermined temperature is greater than a condensation point of the processing fluid. The heaters 252, 254, 258, 362, 364, and 366 may be optionally covered with a layer of thermal insulation to prevent loss of heat into the outside environment, thereby improving temperature control efficiency of the fluid inlet circuit 200 and the fluid outlet circuit 300. The heaters 252, 254, 258, 362, 364, and 366 may be lamps, resistive heating elements, fluid conduits for flowing a heat transfer fluid, or other suitable heating devices. In the embodiments as shown in FIGS. 2 and 3, the heaters 252, 254, 258, 362, 364, and 366 are resistive heaters wound around the elements of the fluid circuits 200 and 300. The heaters 252, 254, 258, 362, 364, and 366 are individually coupled to the power source 105. In some embodiments, each of the heaters 252, 254, 258, 362, 364, and 366 may be independently controlled. The temperature sensors 251, 253, 256, 367, 368 and 369 may each be a non-contact sensor, such as an infrared sensor, or a contact sensor, such as a thermocouple.

The inlet isolation valve 255 and the outlet isolation valve 365 are shutoff valves. When the inlet isolation valve 255 is open, the outlet isolation valve 365 is closed such that a processing fluid flowing through source conduit 257 enters into the inlet conduit 259 and the processing region 125 within the internal volume 150. On the other hand, when the outlet isolation valve 365 is open, the inlet isolation valve 255 is closed such that a gaseous product is removed from the processing region 125 and flows through the outlet conduit 361 and the exhaust conduit 363 into the condenser 360.

It is contemplated that the processing fluid is selected according to the process requirements for the desired annealing of the substrates in the batch processing chamber 100. The processing fluid may comprise an oxygen-containing and/or nitrogen-containing gas, such as oxygen, steam, water, hydrogen peroxide, and/or ammonia. Alternatively or in addition to the oxygen-containing and/or nitrogen-containing gases, the processing fluid may contain a silicon-containing gas such as but not limited to one or more organosilicon compounds, one or more tetraalkyl orthosilicates, one or more disiloxanes, or any combination thereof. In some embodiments, the processing fluid may be steam under a pressure of up to 70 bar and at a temperature of about 550° C.

Returning to FIGS. 1A and 1B, the batch processing chamber also includes a controller 180. The controller 180 controls the operation of the actuators 170, 194a, 194b, and 190, as well as the power source 105 of the batch processing chamber 100. The controller 180 is also connected to the cooling fluid source 177, the inlet fluid circuit 200 (FIG. 2) and the outlet fluid circuit 300 (FIG. 3). The controller 180 is communicatively connected to the pressure sensor 122 and the temperature sensors 114 and 124. The controller 180 includes a central processing unit (CPU) 182, a memory 184, and a support circuit 186. The CPU 182 may be any form of general purpose computer processor that may be used in an industrial setting. The memory 184 may be random access memory, read only memory, floppy, or hard disk drive, or other form of digital storage. The support circuit 186 is conventionally coupled to the CPU 182 and may include cache, clock circuits, input/output systems, power supplies, and/or the like.

The batch processing chamber 100 is configured for annealing a plurality of substrates 135 under a pressure of up to 70 bars and at a temperature of about 550° C. During operation, the heaters 112 are powered on to pre-heat the batch processing chamber 100 and maintain the internal volume 150 at a temperature of greater than 290° C. to avoid condensation of a super-heated processing fluid subsequently introduced into the batch processing chamber 100.

The controller drives one or more actuators 190, 194a, 194b to open the loading port 158. Concurrently or after opening the loading port 158, the shaft 174 is actuated by the actuator 170 to raise the cassette 130 within the internal volume 150 of the batch processing chamber 100. The shaft 174 incrementally aligns each substrate storage slot 138 with the loading port 158 so that the plurality of substrates 135 from a robotic end effector (not shown) can be loaded individually on a respective substrate storage slot 138. Once the plurality of substrates 135 is loaded into the cassette 130, the loading port 158 is closed.

The shaft 174 is actuated by the actuator 170 to lower the cassette 130 within the internal volume 150 of the batch processing chamber 100. As the cassette 130 settles into the lowered position, the plug 172 engages the inner surface 151 to seal the opening 154. At the same time, the lid 140 of the cassette 130 is disposed over the wall 123 of the shell 120, thus defining the processing region 125.

The heaters 127 positioned within the interior of the shell 120 are powered on by the power source 105 to maintain the processing region 125 and the plurality of substrates 135 at a temperature of about 550° C. A processing fluid in a super-heated state is introduced by the gas panel 250 into the processing region 125 through the inlet conduit 259 of the inlet fluid circuit 200. The outlet fluid circuit 300 is non-operational during introduction of fluid through the inlet conduit 259. As fluid is introduced into the processing region 125, the pressure at which the fluid is applied is increased incrementally. In one example, the fluid is steam which is introduced into the processing region 125 until a pressure of about 70 bar is established within the processing region 125. Once a desired pressure is established within the processing region, the flow of fluid is halted.

The plurality of substrates 135 is exposed to the processing fluid, e.g., steam, under high pressure and at a high temperature to anneal the plurality of substrates 135. During processing of the plurality of substrates 135, the processing region 125, the inlet conduit 259 and the outlet conduit 361 are maintained at a temperature and pressure such that the processing fluid stays in gaseous phase. For example, the temperatures of the processing region 125, the inlet conduit 259 and the outlet conduit 361 are maintained at a temperature greater than the condensation point of the processing fluid at the applied pressure. The processing region 125, the inlet conduit 259 and the outlet conduit 361 are maintained at a pressure less than the condensation pressure of the processing gas at the applied temperature. The controller 180 uses information from the temperature sensors 114 and 124, the temperature reading devices 205 and 305, and the pressure sensor 122 to control the flow of processing fluid, the applied pressure, and applied heat with respect to the batch processing chamber 100.

Once the annealing process is complete, the outlet fluid circuit 300 is activated to facilitate removal of the processing fluid form the processing region 125. The processing fluid exits the processing region through the outlet conduit 361 of the outlet fluid circuit 300. The inlet fluid circuit 200 is non-operational during removal of processing gas from the processing region 125. The heater 127 is powered off after removal of the processing fluid from the processing region 125 to mitigate the formation of condensate within the processing region 125. The shaft 174 is then actuated by the actuator 170 to raise the cassette 130 within the internal volume 150 of the batch processing chamber 100. The loading port 158 is then opened via actuation of the slit valve door 195, and the substrates 135 are removed individually from the batch processing chamber 100.

In one aspect, the batch processing chamber 100 operates at a pressure less than 0.5 atm, when loading and unloading the plurality of substrates 135 to/from the cassette 130. During such low-pressure operation, the vacuum lip seal 160 is active as the shaft 174 moves the cassette 130 up and down within the internal volume 150. The vacuum lip seal 160 prevents the leakage of additional pressurized fluid or air into the internal volume 150 by sealing around the shaft 174. To facilitate leak mitigation, the vacuum lip seal is coupled to a vacuum pump (not shown) to withdraw fluid or air through an outlet 169. In one example, if the seal 175 fails, the vacuum lip seal 160 facilitates removal of any pressurized processing fluid through the outlet 169 such that the vacuum integrity of the batch processing chamber 100 can be maintained during the low-pressure operation.

The batch processing chamber described herein offers a number of benefits. The batch processing chamber is configured to operate under high pressure as well as under vacuum. The batch processing chamber incorporates a hollow cylindrical shell having a number of heaters disposed on the inner surface to heat a plurality of substrates up to 550° C. during processing, such as annealing. At the same time, the shell acts as a heat shield to prevent the heat inside the shell from propagating to the chamber walls, allowing the temperature of the chamber walls to remain in a range from about 290° C. to about 325° C. Maintaining the temperature of the chamber walls in a range from about 290° C. to about 325° C. enables the use of seals to close the ports to the chamber without temperature degradation of the seals. Without the use of such seals, metal seals would be needed. However, metal seals require permanent installation and have limited reuse capability. Additionally, metal seals have a tendency to generate unwanted particle contamination.

Additionally, the positioning of seals allows the use pressure to form a more robust seal. It is contemplated that the disclosed plug coupled and the slit valve door both benefit from such seal positioning.

Finally, the inlet fluid circuit and the outlet fluid circuit disclosed herein offer the advantage of controlling and maintaining the temperature of a processing fluid above the condensation point of the processing fluid flowing therethrough. A number of heaters and temperature sensors coupled to different portions of the inlet fluid circuit and outlet fluid circuit help the controller control and maintain the heat supply to the inlet fluid circuit, the outlet fluid circuit and the chamber. The additional temperature control provided by aspects disclosed herein prevents the condensation of the processing fluid and maintains the processing fluid in the gaseous phase, thereby improving overall processing of the substrate.

While the foregoing is directed to particular embodiments of the present disclosure, it is to be understood that these embodiments are merely illustrative of the principles and applications of the present disclosure. It is therefore to be understood that numerous modifications may be made to the illustrative embodiments to arrive at other embodiments without departing from the spirit and scope of the present inventions, as defined by the appended claims.

What is claimed is:

1. A batch processing chamber, comprising:
   a chamber body enclosing an internal volume, the chamber body having an opening formed through a bottom wall thereof;
   a slit valve door configured to sealably close a loading port formed through the chamber body, the slit valve door comprising seals which engage an inner surface of the chamber body;
   a cassette moveably disposed within the internal volume, the cassette configured to be raised to a first position to load a plurality of substrates therein, and lowered into a second position beneath the first position for processing;
   a shaft disposed through the opening formed in the chamber body and coupled to the cassette;
   a plug coupled to a bottom wall of the cassette, the plug comprising a downward-facing seal configured to engage with a top surface of the bottom wall of the chamber body when the cassette is in the second position, the seal circumscribing the opening and the shaft, and sealable against the bottom wall of the chamber body when the cassette is in the second position; and
   a heater disposed in a sidewall of the chamber body and operable to maintain the chamber body at a temperature of greater than 290° C.

2. The batch processing chamber of claim 1, further comprising a hollow cylindrical shell disposed within the internal volume and having one or more heaters disposed on an inner surface of the hollow cylindrical shell.

3. The batch processing chamber of claim 1, further comprising a lid disposed on the cassette, the lid having a diameter greater than an outer diameter of the hollow cylindrical shell.

4. The batch processing chamber of claim 1, wherein the bottom wall of the chamber body comprises a stepped opening to accommodate the plug.

5. The batch processing chamber of claim 1, further comprising a thermal break disposed between the bottom wall of the cassette and the plug.

6. The batch processing chamber of claim 1, further comprising a cooling channel disposed within the plug.

7. The batch processing chamber of claim 1, wherein the bottom wall of the cassette comprises openings configured to allow a fluid to pass therethrough.

8. A batch processing chamber, comprising:
   a chamber body enclosing an internal volume;
   a slit valve door configured to sealably close a loading port formed through the chamber body, the slit valve door comprising seals which engage an inner surface of the chamber body;
   a cassette moveably disposed within the internal volume, the cassette movable between a first position and a second position beneath the first position;
   a hollow cylindrical shell disposed within the internal volume and surrounding the cassette when the cassette is in the second position;
   a heater disposed in a sidewall of the chamber body and operable to maintain the chamber body at a temperature of greater than 290° C.; and
   an additional heater disposed between an inner surface of the hollow cylindrical shell and the cassette when the cassette is in the second position.

9. The batch processing chamber of claim 8, further comprising:
   a plug coupled to a bottom wall of the cassette and configured to move up and down within the internal volume, the plug comprising:
      a downward-facing seal configured to engage with a top surface of a bottom wall of the chamber body.

10. The batch processing chamber of claim 8, further comprising a lid disposed on the cassette, the lid having a diameter greater than an outer diameter of the hollow cylindrical shell.

11. The batch processing chamber of claim 8, wherein a bottom wall of the cassette comprises openings formed therethrough to allow a fluid to pass therethrough.

12. The batch processing chamber of claim 8, wherein a bottom wall of the chamber body comprises a stepped opening to accommodate the plug.

13. The batch processing chamber of claim 8, further comprising a thermal break disposed between a bottom wall of the cassette and the plug.

14. The batch processing chamber of claim 8, further comprising a cooling channel disposed within the plug.

15. The batch processing chamber of claim 12, further comprising a thermal break disposed between the bottom wall of the cassette and the plug, the thermal break comprising a capsulated cup.

16. A batch processing chamber, comprising:
- a chamber body enclosing an internal volume, the chamber body having an opening formed through a bottom wall thereof;
- a slit valve door configured to sealably close a loading port formed through the chamber body, the slit valve door comprising seals which engage an inner surface of the chamber body;
- a cassette moveably disposed within the internal volume, the cassette configured to be raised to a first position to load a plurality of substrates therein, and lowered into a second position beneath the first position for processing;
- a plug coupled to a bottom wall of the cassette, the plug comprising a downward-facing seal configured to engage with a top surface of the bottom wall of the chamber body when the cassette is in the second position, the seal circumscribing the opening, and sealable against the bottom wall of the chamber body when the cassette is in the second position;
- a heater disposed in a sidewall of the chamber body and operable to maintain the chamber body at a temperature of greater than 290° C.; and
- an additional heater disposed within the internal volume.

17. The batch processing chamber of claim 16, further comprising a shaft disposed through the opening formed in the chamber body and coupled to the cassette.

18. The batch processing chamber of claim 16, further comprising a hollow cylindrical shell disposed within the internal volume, wherein the additional heater is disposed on an inner surface of the hollow cylindrical shell.

19. The batch processing chamber of claim 16, further comprising a thermal break disposed between the bottom wall of the cassette and the plug.

20. The batch processing chamber of claim 16, further comprising a cooling channel disposed within the plug.

* * * * *